United States Patent [19]
Yagi et al.

[11] Patent Number: 5,140,175
[45] Date of Patent: Aug. 18, 1992

[54] LIGHT-EMITTING DIODE DRIVE CIRCUIT WITH FAST RISE TIME AND FALL TIME

[75] Inventors: Keiji Yagi; Kazuhiro Zenba; Yukihiro Sekiguchi, all of Kawasaki; Fumio Ishikawa, Atsugi; Tetsuo Yamamoto, Yokohama; Takayuki Aoki, Atsugi, all of Japan

[73] Assignee: Mitsubishi Rayon Co., Ltd., Tokyo, Japan

[21] Appl. No.: 651,364

[22] PCT Filed: Jun. 22, 1990

[86] PCT No.: PCT/JP90/00810
§ 371 Date: May 3, 1991
§ 102(e) Date: May 3, 1991

[87] PCT Pub. No.: WO91/00621
PCT Pub. Date: Jan. 10, 1991

[30] Foreign Application Priority Data

Jun. 24, 1989 [JP] Japan ................... 1-161861
Jun. 24, 1989 [JP] Japan ................... 1-161862

[51] Int. Cl.⁵ .......................... H03K 3/01; H03S 3/00
[52] U.S. Cl. ........................... 307/270; 307/311; 307/268; 372/38
[58] Field of Search ............ 307/311, 270, 268, 264, 307/355; 372/38, 25

[56] References Cited

U.S. PATENT DOCUMENTS 4,799,224  1/1989  Bottacchi et al. ............ 307/311 X
5,015,873  5/1991  Hirayama .................... 307/311 X

FOREIGN PATENT DOCUMENTS 0137340  8/1983  Japan .
0077173  4/1988  Japan .
0234568  9/1988  Japan .
0064267  3/1989  Japan .

Primary Examiner—John S. Heyman
Assistant Examiner—Toan Tran
Attorney, Agent, or Firm—Woodcock, Washburn, Kurtz, Mackiewicz & Norris

[57] ABSTRACT

A light-emitting diode drive circuit of the present invention comprises: a current supply circuit (3) including a first transistor (16), the base of which receives a first drive pulse signal (S3) output from a signal input circuit, and a second transistor (15), the collector of which is connected to a light-emitting diode (2), the emitter of which is connected to a current source (24) together with the emitter of the first transistor (16), and the base of which receives a second drive pulse signal (S2) having a phase opposite to that of the first drive pulse signal (S3); a fall time shortening circuit (6) including a third transistor (13) which is connected in parallel with the light-emitting diode (2) and the base of which receives an input for short-circuiting both terminals of the light-emitting diode (2) during a turn-OFF time; and a rise time shortening circuit (5) including a circuit (4) for generating a peaking current during a turn-ON time of the light-emitting diode (2), and a fourth transistor (14) being connected in series with the third transistor (13) and adding the peaking current to the drive current during the turn-ON time of the light-emitting diode (2), wherein rise and fall times of the light pulse output are shortened to greatly increase a response speed of the light-emitting diode (2) having poor inherent response characteristics, such as a red light-emitting diode having a short wavelength range.

6 Claims, 4 Drawing Sheets

LIGHT-EMITTING DIODE DRIVE CIRCUIT WITH FAST RISE TIME AND FALL TIME

TECHNICAL FIELD

The present invention related to a light-emitting diode drive circuit and, more particularly, to a light-emitting drive circuit suitably used in optical fiber communications.

BACKGROUND ART

In optical communications of digital signals, an information carrier is not an electrical pulse but a light pulse. A light-emitting diode and a semiconductor laser are generally popular as its light sources. The semiconductor laser has an advantage in facilitation of high-speed driving, but is thermally unstable. In order to stabilize the operation of the semiconductor laser, a circuit is undesirably complicated, resulting in an economical disadvantage.

To the contrary, when a light-emitting diode is used as a light source, optical communication can be performed using a simple drive circuit. In particular, in optical communication using an optical fiber, a red light-emitting diode for emitting red light having a wavelength of about 660 nm in a visible range is excellent in transmission loss characteristics of an optical fiber for this wavelength. In addition, the red light-emitting diode is relatively easily accessible and is very popular.

A basic block diagram of a conventional light-emitting diode drive circuit for driving a light-emitting diode upon reception of an electrical pulse signal is shown in FIG. 6. The circuit shown in FIG. 6 comprises a signal input circuit 61 for outputting drive pulse signals S2 and S3 in response to an input pulse signal S1 and a current supply circuit 63 for supplying a drive current to a light-emitting diode 62.

Conventional examples of the main part (current supply circuit 63) of the light-emitting diode drive circuit are shown in FIGS. 7(a), 7(b), and 8.

The conventional examples shown in FIGS. 7(a) and 7(b) are circuits each arranged such that a transistor 71 which receives an input signal Si at its base and a parallel circuit of a capacitor Cs and a resistor Rs are connected in series with a light-emitting diode 62.

The conventional example shown in FIG. 8 comprises two transistors 80 and 81 which have identical characteristics and emitters of which are connected to each other. The collector of one transistor 81 is connected to a voltage source Vcc through a light-emitting diode 62, and the collector of the other transistor 81 is directly connected to the voltage source Vcc. The commonly connected emitters of the transistors 80 and 81 are grounded through a collector-emitter path of a transistor 86 and a resistor 85. Note that the transistor 86 constitutes a constant current circuit 87 together with a transistor 82, and resistors 83 and 84 and the resister 85.

Drive pulse signals S2 and S3 output from a signal input circuit 61 are input to the bases of the differentially connected transistors 80 and 81, respectively. Since the drive pulse signals S2 and S3 have an inverse relationship, one transistor 80 is kept ON, while the other transistor 81 is kept OFF. To the contrary, when one transistor 80 is kept OFF, the other transistor 81 is kept ON. By controlling operations of the differentially connected transistors 80 and 81 as described above, the light-emitting diode 62 is driven to be turned on/off.

In optical communication which requires high-speed response, however, since the red light-emitting diode having a short wavelength range requires a longer charge/discharge time at the time of turn-ON/OFF operation of the light-emitting diode than that of a general infrared light-emitting diode. Therefore, waveform distortion of a light pulse output is increased, and a response speed is decreased, thus posing problems.

In a light-emitting diode drive circuit to drive a light-emitting diode having these problems in response to an input signal, only a light output pulse having response characteristics depending on a low response speed unique to the light-emitting diode can be obtained in accordance with a system for simply turning on/off a current supplied to the light-emitting diode.

In addition, a semiconductor light-emitting element such as a light-emitting diode has a parallel electrostatic capacitance (to be simply referred to as a capacitance) between anode and cathode terminals of the semiconductor light-emitting element. For this reason, when a light-emitting diode is to be driven at high speed, charge/discharge time of the capacitance equivalently present in each light-emitting diode cannot be neglected. A trailing phenomenon occurs in leading and trailing edge portions of an output waveform due to light pulse output waveform distortion.

Various conventional proposals have been made to prevent a phenomenon in which leading and trailing periods of the light pulse output are prolonged. These proposals are exemplified by a light-emitting diode drive circuit (Japanese Patent Laid-Open No. 56-87189) for separating a route for charging a capacitance of a light-emitting diode from a route for discharging the capacitance of the light-emitting diode, a light-emitting diode drive circuit (Japanese Patent Laid-Open No. 58-137340) for adding a peaking current to a drive current during a rise time to shorten the rise time, and for reverse-biasing the light-emitting diode during a fall time, a light-emitting diode drive circuit (Japanese Patent Laid-Open No. 60-180232) in which an equivalent voltage source and a resistor are connected in parallel with a light-emitting diode, a light-emitting diode drive circuit (Japanese Utility Model Laid-Open No. 62-167436) in which a transistor is connected in parallel with a light-emitting diode to short-circuit both terminals of the light-emitting diode during a fall time, a light-emitting diode drive circuit (Japanese Patent Laid-Open No. 63-234568) in which a transistor is connected in parallel with a light-emitting diode to short-circuit both terminals of the light-emitting diode during fall time, and turn-ON/OFF switching is performed by a differential circuit, and a light-emitting diode drive circuit (Japanese Patent Laid-Open No. 64-64267) in which a transistor is connected in parallel with a light-emitting diode, a constant current source is connected in series with the light-emitting diode, and a differentiation circuit is arranged between the input terminal of the transistor and a connecting point between the light-emitting diode and the constant current source.

In each of the conventional light-emitting diode drive circuits, however, good response characteristics are not necessarily obtained for high-speed driving of a light-emitting diode (particularly, a red light-emitting diode having a short wavelength range).

In each of the conventional light-emitting diode drive circuits, a current consumed by the light-emitting diode varies to generate noise on a power source line. This noise causes a circuit operation error, and reliability of the circuit is degraded. In particular, when a high-speed operation is to be performed, this noise is much produced.

DISCLOSURE OF INVENTION

The present invention has been made in consideration of the above background, and has as its object to provide a light-emitting diode drive circuit capable of shortening rise and fall times of a light pulse output and capable of greatly increasing a response speed even in a light-emitting diode having poor inherent response characteristics, such as a red light-emitting diode having a short wavelength range.

A light-emitting diode drive circuit according to the present invention is characterized by comprising:

(a) a signal input circuit for receiving an external input pulse signal and outputting first and second drive pulses in response the input pulse signal;

(b) a current supply circuit including a first transistor, a collector of which receives a power source voltage and a base of which receives the first drive pulse signal output from the signal input circuit, and a second transistor, a collector of which is connected to the light-emitting diode, an emitter of which is connected to a current source together with an emitter of the first transistor and a base of which receives the second drive pulse signal having a phase opposite to that of the first drive pulse signal, the current supply circuit being arranged to control a drive current supplied to the light-emitting diode on the basis of the first and second drive pulse signals;

(c) a fall time shortening circuit including a third transistor, a collector and an emitter of which are respectively connected to both terminals of the light-emitting diode so that the third transistor is connected in parallel with the light-emitting diode, the collector of which receives the power source voltage, and a base of which receives an input for short-circuiting both the terminals of the light-emitting diode during a turn-OFF time, the fall time shortening circuit being arranged to shorten a fall time of the light pulse output during the turn-OFF time; and (d) a rise time shortening circuit including a circuit for generating a peaking current during a turn-ON time of the light-emitting diode, and a fourth transistor, a collector of which is connected to the emitter of the third transistor so that the fourth transistor is connected in series with the third transistor, and a base and an emitter of which are connected to the peaking current generating circuit to add the peaking current to the drive current during the turn-ON time of the light-emitting diode, the rise time shortening circuit being arranged to shorten the rise time of the light pulse output during the turn-ON time.

According to a preferred embodiment of the present invention, at least the fall time shortening circuit, the rise time shortening circuit, and the current supply circuit are monolithically integrated with each other.

According to a preferred embodiment of the present invention, the rise time shortening circuit comprises a differentiation circuit including a capacitor and a resistor.

According to another preferred embodiment of the present invention, the rise time shortening circuit is arranged to add the peaking current to the drive current during the turn-ON time and to cause the peaking current to flow in parallel with the drive current after the light pulse output is rised.

The light-emitting diode drive circuit having the above arrangement according to the present invention is operated as follows.

The signal input circuit supplies drive pulse signals to the rise time shortening circuit, the fall time shortening circuit, and the current supply circuit in response to the input pulse signal.

The current supply circuit supplies a steady drive current ID to the light-emitting diode. The differential transistors in the current supply circuit receive a noninverted drive pulse signal and an inverted drive pulse signal in response to the input pulse signal input to the signal input circuit. The drive current is switched in accordance with these drive pulse signals, thereby controlling supply of the drive current.

During the turn-ON time, the rise time shortening circuit adds the peaking current IP from the peaking current generating circuit to the steady drive current ID by the fourth transistor during a period determined by a set time constant to supply a sufficiently large drive current to the light-emitting diode. As a result, since the capacitance present equivalently in the light-emitting diode can be abruptly charged, the rise time of the light emission pulse (light pulse output) emitted from the light-emitting diode can be shortened. During the turn-OFF time, in the rise time shortening circuit, the third transistor connected in parallel with the light-emitting diode short-circuits both the terminals of this light-emitting diode. As a result, although a very low saturation voltage is left between both the terminals of the light-emitting diode, the charge stored in the capacitance of the light-emitting diode is forcibly discharged. By this forcible discharge, the fall time of the light pulse output waveform is shortened.

According to one aspect of the present invention, while the peaking current does not flow through the light-emitting diode, a current component corresponding to the peaking current flows through a circuit connected in parallel with the light-emitting diode, so that variations in current consumed by the entire circuit can be prevented.

The light-emitting diode drive circuit according to the present invention has the following effects.

Since a high-speed operation at a speed exceeding a response speed inherent to each light-emitting diode can be achieved, the rise and fall times of the light pulse output can be shortened, and the response speed can be greatly reduced even in a light-emitting diode having poor response characteristics as in a red light-emitting diode having a short wavelength range.

Since the rise and fall times of the light pulse output are shortened, delay can be suppressed, distortion of a pulse width can also be suppressed, and high-speed driving can be performed.

In the light-emitting diode drive circuit according to the present invention, a circuit requiring complicated timings, a capacitor having a large capacitance, and a coil are not required. The number of parts can be reduced, and the drive circuit can be arranged using a single power source.

In the light-emitting diode drive circuit according to the present invention, all or some of the components of the circuit can be easily monolithically integrated. Therefore, the drive circuit can have higher reliability than a circuit arranged by using separate parts, thereby obtaining a compact, low-cost light-emitting diode drive circuit having low current consumption.

In the light-emitting diode drive circuit according to one embodiment of the present invention, since a current flowing through the entire light-emitting diode drive circuit can be maintained to be a predetermined value, noise on a power source line can be reduced. An operation error of a peripheral circuit can be prevented, and therefore there is provided a light-emitting diode drive circuit for optical communications, which has high reliability.

EMBODIMENTS

The present invention will be described below in detail with reference to embodiments of the present invention. The present invention is not limited to the following embodiments. Various changes and modifications may be made within the spirit and scope of the invention.

Figure 1:
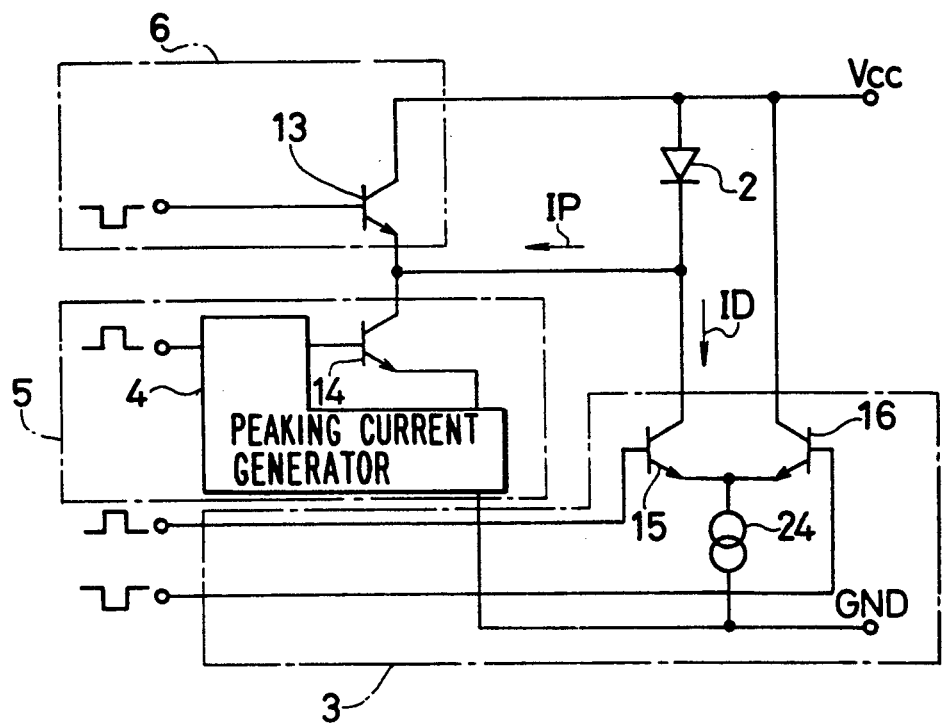
FIG. 1 is a schematic circuit diagram of an embodiment of a light-emitting diode drive circuit according to the present invention.

Arrangements of a power source supply circuit, a rise time shortening circuit, and a fall time shortening circuit in an embodiment of a light-emitting diode drive circuit according to the present invention are shown in FIG. 1. A detailed circuit of an end stage portion of the light-emitting diode drive circuit shown in FIG. 1 is shown in FIG. 2.

Figure 4:
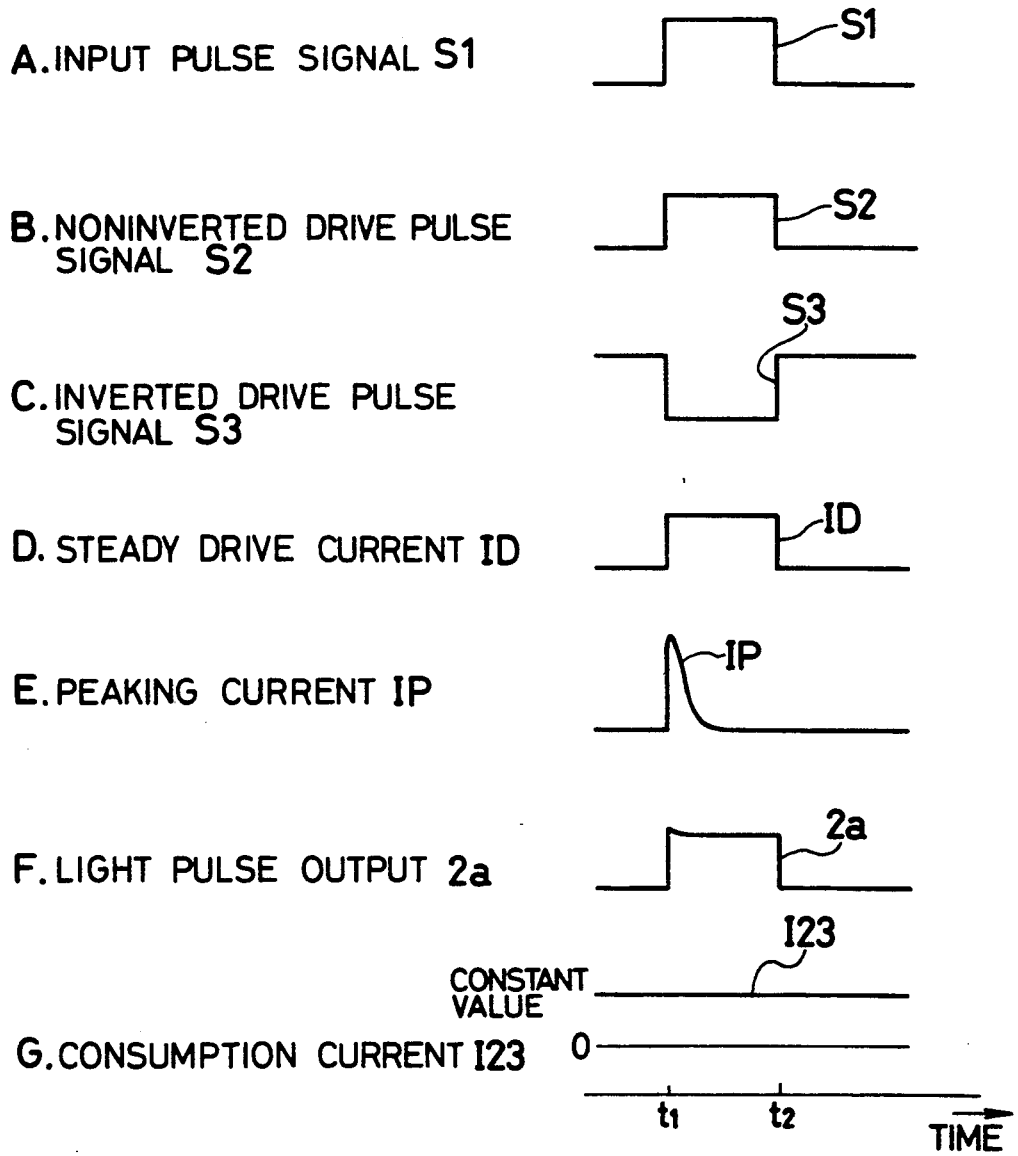
FIG. 4 is a waveform chart of respective portions in the light-emitting diode drive circuit shown in FIGS. 1 to 3.
Figure 6:
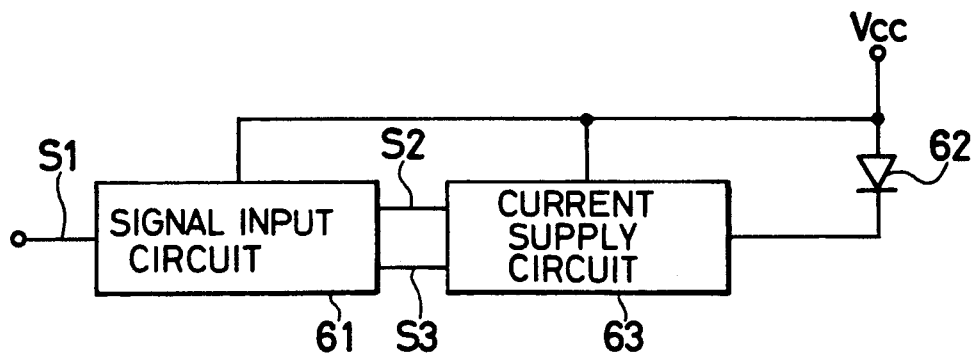
FIG. 6 is a basic block diagram of a conventional light-emitting diode drive circuit, and FIGS. 7(a), (7b) and 8 are detailed circuit diagrams showing main portions of the conventional light-emitting diode drive circuit.
Figure 7A:
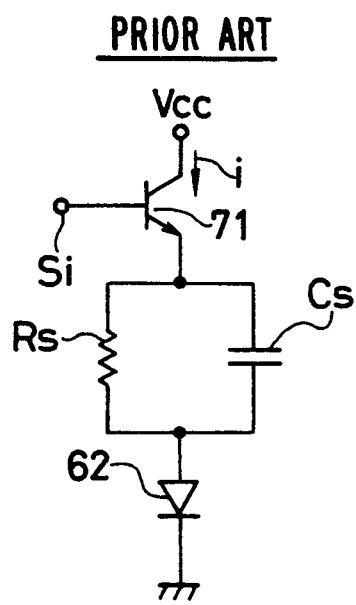
Figure 7B:
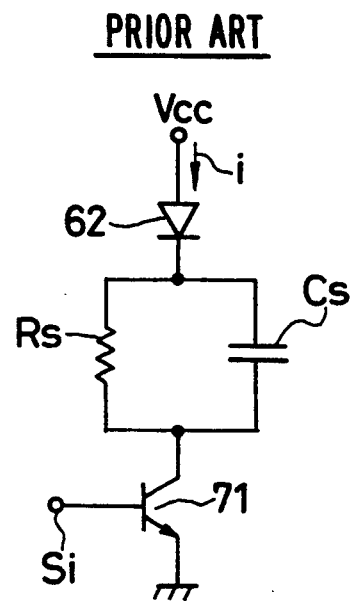
Figure 8:
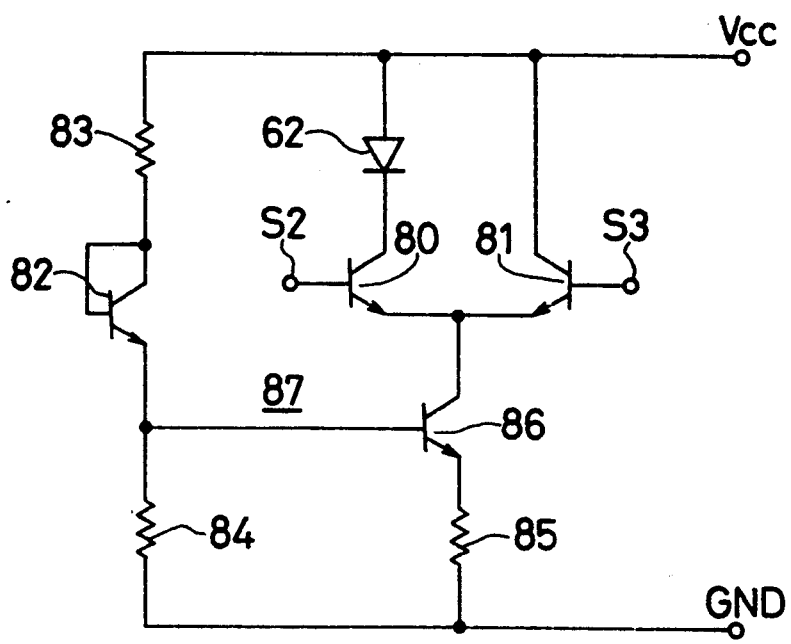

A signal input circuit (not shown; this circuit may be identical with that shown in, e.g., FIG. 6) has an inverting amplifier and a noninverting amplifier. When an input pulse signal S1 is input to the input terminal of the signal input circuit, the circuit outputs the noninverted and inverted drive pulse signals S2 and S3. More specifically, when the input pulse signal S1 set at high level from time t1 to time t2 is input to the input terminal, as shown in FIG. 4A, the noninverted drive pulse signal S2 and the inverted drive pulse signal S3 are output, as shown in FIGS. 4B and 4C, respectively.

As shown in FIG. 1, a current supply circuit 3 comprises a first transistor 16, the collector of which receives a power source voltage and the base of which receives the inverted output of the drive pulse signals output from the signal input circuit, and a second transistor 15, the collector of which is connected to a light-emitting diode 2, the emitter of which is connected to a current source 24 together with the emitter of the first transistor 16, and the base of which receives the noninverted output of the drive pulse signals.

Figure 2:
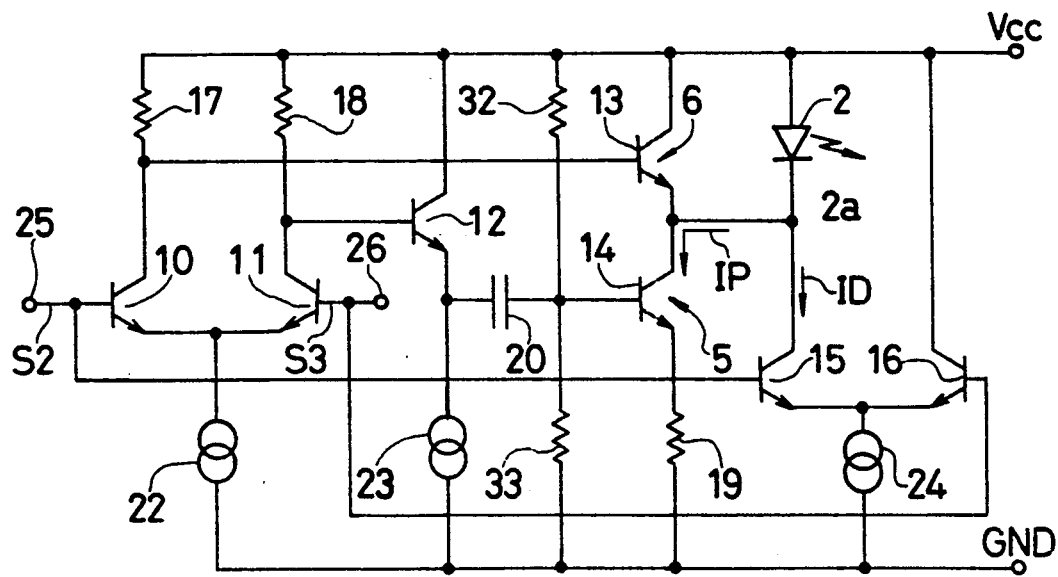
FIG. 2 is a detailed circuit diagram showing an end stage portion of the light-emitting diode drive circuit shown in FIG. 1.

As shown in FIG. 2 in a more detailed arrangement than that in FIG. 1, a circuit for driving a rise time shortening circuit 5 and a fall time shortening circuit 6 comprises differentially connected transistors 10 and 11, resistors 17 and 18 respectively connected to the collectors of the transistors 10 and 11, and a constant current source 22 connected to the emitters of the transistors 10 and 11.

Referring to FIG. 2, the rise time shortening circuit 5 comprises a differentiation circuit of a capacitor 20 and resistors 32 and 33, a peaking current generating circuit 4 of a resistor 19, a fourth transistor 14 (the base of which is connected to the capacitor 20 and the emitter of which is connected to ground GND through the resistor 19), and a transistor 12 (the emitter of which is connected to the base of the fourth transistor 14 through the capacitor 20). The emitter of the transistor 12 is connected to ground GND through a constant current source 23.

Referring to FIG. 2, the fall time shortening circuit 6 comprises a third transistor 13 connected in parallel with the light-emitting diode 2 The base of the transistor 12 receives the inverted drive pulse signal during a turn-OFF time.

An operation of the circuit of the embodiment shown in FIGS. 1 and 2 will be described below.

The inverted (opposite-phase) and noninverted (in-phase) drive pulse signals S2 and S3 from the signal input circuit as a previous stage circuit are input to differential input terminals 25 and 26. The noninverted drive pulse signal S2 input to the input terminal 25 is applied to the bases of the transistors 10 and 15. The inverted drive pulse signal S3 input to the input terminal 26 is applied to the bases of the transistors 11 and 16.

In this case, when the noninverted drive pulse signal S2 applied to the input terminal 25 is set at high level and the inverted drive pulse signal S3 applied to the input terminal 26 is set at low level, the transistor 15 is turned on. A steady forward current ID shown in FIG. 4D and set by the constant current circuit 24 is supplied to the light-emitting diode 2. As a result, the light-emitting diode 2 emits light.

In a transient state wherein the steady drive current ID is about to flow, a peaking current IP whose peak value is sufficiently larger than that of the steady drive current ID is generated by the differentiation circuit of the capacitor 20 and the resistors 32 and 33 and the peaking current generation circuit 4 of the resistor 19, as shown in FIG. 4E. The peaking current IP is supplied to the light-emitting diode 2 through the fourth transistor 14 during a period determined by an appropriately set time constant.

Upon supply of this peaking current IP, a total drive current during the rise time becomes IP+ID (a sum of IP and ID), a sufficiently large current is supplied to the light-emitting diode 2. For this reason, as the capacitance equivalently present in the light-emitting diode 2 is abruptly charged, the rise time of a light pulse output 2a is greatly shortened to achieve a high-speed rise operation, as shown in FIG. 4F. After the light pulse output 2a is raised, the drive current returns to have a steady current value, so that steady light emission can be maintained.

When a turn-OFF time of the light-emitting diode 2 is started (i.e., the input signal to the input terminal 25 is set at low level, or the input signal to the input terminal 26 is set at high level), the transistor 15 for performing a current switching operation is turned off, while the transistor 16 is turned on. Therefore, the steady current ID set by the constant current circuit 24 flows through the transistor 16, and a current does not flow through the light-emitting diode 2.

In the embodiment shown in FIGS. 1 and 2, when the turn-OFF time of the light-emitting diode 2 is started, the transistor 13 connected in parallel with the light-emitting diode 2 is turned on, so that both the terminals of the light-emitting diode 2 are short-circuited. As a result, the charge stored in the capacitance of the light-emitting diode 2 is forcibly discharged to greatly shorten the fall time of the light pulse output 2a.

The rise and fall response times of the transistors can be neglected as compared with the response speed of the light-emitting diode.

Another embodiment of the present invention in addition to the above embodiment will be described below.

Figure 3:
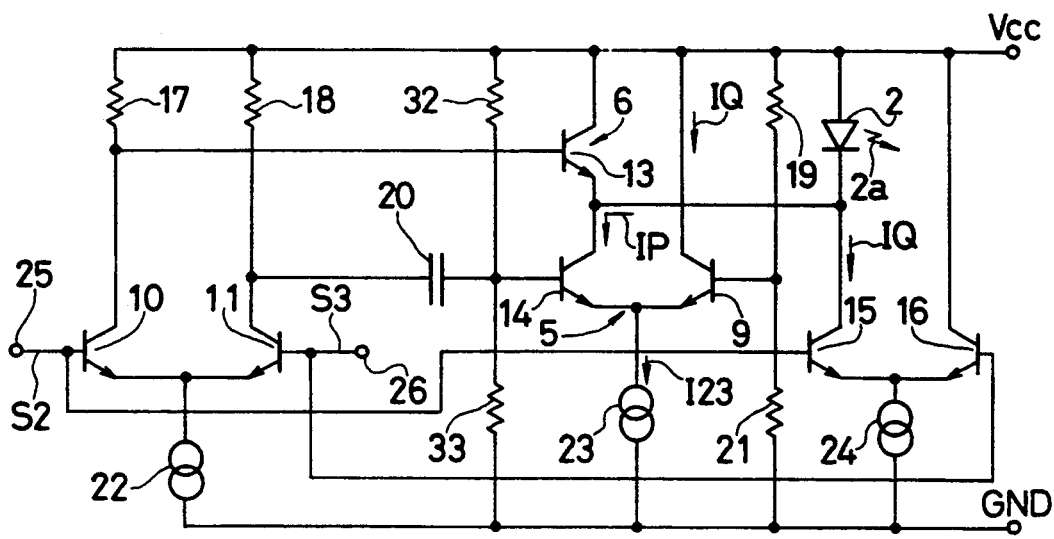
FIG. 3 is another detailed circuit diagram of the light-emitting diode drive circuit shown in FIG. 1.

FIG. 3 shows a detailed circuit of an end stage portion of the light-emitting diode drive circuit shown in FIG. 1. The circuit in FIG. 3 is arranged such that a rise time shortening circuit 5 has an arrangement different from that shown in FIG. 2. Other circuit arrangements of the circuit shown in FIG. 3 are the same as those of the circuit in FIG. 2.

The rise time shortening circuit 5 in the embodiment of FIG. 3 comprises a fourth transistor 13 for supplying a peaking current IP to a light-emitting diode 2 for a predetermined period of time, a transistor 9 differentially connected to the transistor 14, a capacitor 20 connected between the collector of the transistor 11 and the base of the transistor 14, a series circuit of resistors 32 and 33 having a connecting point connected to the base of the transistor 14, and a constant current circuit 23 connected between the commonly connected emitters of a transistor 9 and the transistor 14 and ground GND. Note that the base of the transistor 9 is connected to a power source line Vcc through a resistor 19 and is connected to ground GND through a resistor 21.

An operation of the rise time shortening circuit 5 having an arrangement different from that of the circuit shown in FIG. 2 will be described with reference to the embodiment of FIG. 3.

Referring to FIG. 3, in a transient state wherein a steady drive current ID starts to flow during a turn-ON time, upon supply of the steady drive current, the peaking current IP having a time width set by the capacitor 20 and the resistors 32 and 33 is generated, and this peaking current IP is supplied to the light-emitting diode 2 through the fourth transistor 14.

Upon supply of this peaking current IP, a total drive current during the turn-ON time becomes IP+ID, so that a sufficiently large current is supplied to the light-emitting diode 2. For this reason, the capacitance equivalently present in the light-emitting diode 2 is abruptly charged. As shown in FIG. 4F, the rise time of a light pulse output 2a is greatly shortened.

The base of the transistor 9 paired with the transistor 14 to constitute a differential amplifier receives an appropriate bias voltage due to the voltage division resistors 19 and 21, as the base of the transistor 14. For this reason, a current IQ having the same level as but a phase opposite to the peaking current IP flowing through the transistor 14 is supplied to the collector of the transistor 9. At this time, the peaking current flowing through the power source line Vcc becomes a sum of the peaking current IP flowing through the light-emitting diode 2 and the collector current of the transistor 9 which serves as the opposite-phase current, thereby canceling the currents to each other and hence setting the sum to be almost zero. For this reason, leaking of the peaking current outside the circuit to interfere with other devices can be prevented.

In the circuit arrangement shown in FIG. 3, even if the peaking current IP is not supplied to the light-emitting diode 2 (i.e., regardless of the ON or OFF state of the light-emitting diode 2), the magnitude of a current I23 flowing through the constant current circuit 23 is almost constant, as shown in FIG. 4G. Therefore, a current consumed by the entire light-emitting diode drive circuit in FIG. 3 is always almost constant.

Figure 5:
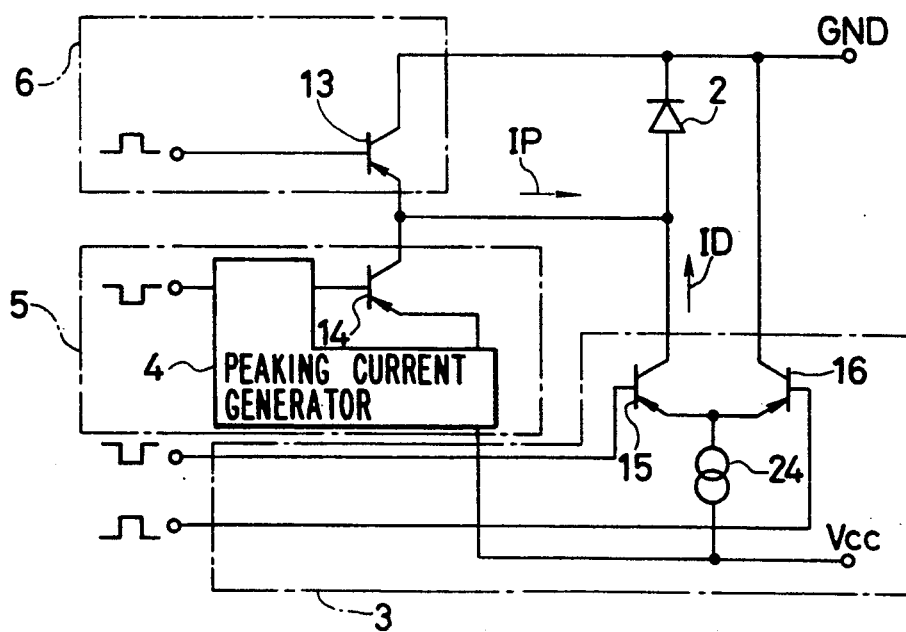
FIG. 5 is a schematic circuit diagram of another embodiment of a light-emitting diode drive circuit according to the present invention.

The present invention is not limited to the embodiments described above. In the above embodiments, NPN transistors are used. However, as still another embodiment shown in FIG. 5 in correspondence with FIG. 1, PNP transistors may be used.

INDUSTRIAL APPLICABILITY

A light-emitting diode drive circuit according to the present invention is suitably used in particularly optical fiber communications.

We claim:

1. A light-emitting diode drive circuit characterized by comprising:
    a signal input circuit for receiving an external input pulse signal and outputting first and second drive pulses in response the input pulse signal;
    a current supply circuit including a first transistor, a collector of which receives a power source voltage and a base of which receives the first drive pulse signal output from said signal input circuit, and a second transistor, a collector of which connected to said light-emitting diode, an emitter of which is connected to a current source together with an emitter of said first transistor and a base of which receives the second drive pulse signal having a phase opposite to that of the first drive pulse signal, said current supply circuit being arranged to control a drive current supplied to said light-emitting diode on the basis of the first and second drive pulse signals;
    a fall time shortening circuit including a third transistor, a collector and an emitter of which are respectively connected to both terminals of said light-emitting diode so that said third transistor is connected in parallel with said light-emitting diode, said collector of which receives the power source voltage, and a base of which receives an input for short-circuiting both said terminals of said light-emitting diode during a turn-OFF time, said fall time shortening circuit being arranged to shorten a fall time of the light pulse output during the turn-OFF time; and
    a rise time shortening circuit including a circuit for generating a peaking current during a turn-ON time of said light-emitting diode, and a fourth transistor, a collector of which is connected to said emitter of said third transistor so that said fourth transistor is connected in series with said third transistor, and a base and an emitter of which are connected to said peaking current generating circuit to add the peaking current to the drive current during the turn-ON time of said light-emitting diode, said rise time shortening circuit being arranged to shorten the rise time of the light pulse output during the turn-ON time.

2. A light-emitting diode drive circuit according to claim 1, characterized in that at least said fall time shortening circuit, said rise time shortening circuit, and said current supply circuit are monolithically integrated with each other.

3. A light-emitting diode drive circuit according to claim 1 or 2, characterized in that said rise time shortening circuit comprises a differentiation circuit including a capacitor and a resistor.

4. A light-emitting diode drive circuit according to claim 1, characterized in that said rise time shortening circuit is arranged to add the peaking current to the drive current during the turn-ON time and to cause the peaking current to flow in parallel with the drive current after the light pulse output is raised.

5. A light-emitting diode drive circuit according to claim 2, characterized in that said rise time shortening circuit is arranged to add the peaking current to the drive current during the turn-ON time and to cause the peaking current to flow in parallel with the drive current after the light pulse output is raised.

6. A light-emitting diode drive circuit according to claim 3, characterized in that said rise time shortening circuit is arranged to add the peaking current to the drive current during the turn-ON time and to cause the peaking current to flow in parallel with the drive current after the light pulse output is raised.

* * * * *

UNITED STATES PATENT AND TRADEMARK OFFICE
CERTIFICATE OF CORRECTION

PATENT NO. : 5,140,175

DATED : August 18, 1992

INVENTOR(S) : Yagi et al.

It is certified that error appears in the above-identified patent and that said Letters Patent is hereby corrected as shown below:

TITLE PAGE
At [73] Assignee, change to read: --Mitsubishi Rayon Co., Ltd. & Sony Corporation, Tokyo, Japan.--

Signed and Sealed this

Twelfth Day of July, 1994

Attest:

BRUCE LEHMAN

Attesting Officer

Commissioner of Patents and Trademarks